(12) United States Patent
Matsuda

(10) Patent No.: US 7,049,657 B2
(45) Date of Patent: May 23, 2006

(54) SEMICONDUCTOR DEVICE HAVING A TRENCH-GATE STRUCTURE

(75) Inventor: Noboru Matsuda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 116 days.

(21) Appl. No.: 10/714,868

(22) Filed: Nov. 18, 2003

(65) Prior Publication Data

US 2004/0188756 A1 Sep. 30, 2004

(30) Foreign Application Priority Data

Mar. 28, 2003 (JP) .............................. 2003-092263

(51) Int. Cl.
*H01L 29/76* (2006.01)
*H01L 29/94* (2006.01)
*H01L 31/62* (2006.01)
*H01L 31/113* (2006.01)
*H01L 31/119* (2006.01)

(52) U.S. Cl. ..................................... 257/333
(58) Field of Classification Search ................ 257/330, 257/333
See application file for complete search history.

(56) References Cited

U.S. PATENT DOCUMENTS 6,262,453 B1 * 7/2001 Hshieh ........................ 257/341

2004/0188756 A1 9/2004 Matsuda

FOREIGN PATENT DOCUMENTS

JP 05-335582 12/1993
JP 2001-284588 * 10/2001

OTHER PUBLICATIONS

U.S. Appl. No. 11/208,619, filed Aug. 23, 2005, Matsuda et al.

* cited by examiner

Primary Examiner—Howard Weiss
(74) Attorney, Agent, or Firm—Oblon, Spivak, McClelland, Maier & Neustadt, P.C.

(57) ABSTRACT

A semiconductor device comprises: a first semiconductor layer of a first conductivity type; a second semiconductor layer of a second conductivity type; a trench; a thick gate insulating film; a thin gate insulating film; a gate electrode; and a semiconductor region of a second conductivity type. The second semiconductor layer is provided on the first semiconductor layer. The trench penetrates the second semiconductor layer and intrudes into the first semiconductor layer. The thick gate insulating film is provided on a inner wall of the trench below an upper surface of the first semiconductor layer. The thin gate insulating film is provided on the inner wall of the trench at a part upper than the thick gate insulating film. The gate electrode fills the trench. The semiconductor region of a second conductivity type is selectively formed to adjoin the trench and to project from a bottom surface of the second semiconductor layer into the first semiconductor layer.

12 Claims, 13 Drawing Sheets

SEMICONDUCTOR DEVICE HAVING A TRENCH-GATE STRUCTURE

CROSS-REFERENCE TO RELATED APPLICATIONS

This application is based upon and claims the benefit of priority from the prior Japanese Patent Application No. 2003-092263, filed on Mar. 28, 2003; the entire contents of which are incorporated herein by reference.

BACKGROUND OF THE INVENTION

The present invention relates to a semiconductor device and its manufacturing method, and more particularly, it relates to a semiconductor device having a trench-gate structure and to a method of manufacturing it.

Semiconductor devices, such as a trench-gate MOSFET (Metal-Oxide-Semiconductor Field Effect Transistor) and IGBT (Insulated Gate Bipolar Transistor), are used for various kinds of fields including electric power switching.

For example, a small trench-gate MOSFET is used in a personal computer as a switching element with high-speed clock frequency of about 500 kHz in order to drop a power supply voltage to a power supply levels of CPU and various disk drives (for example, 1.7 volts).

With regard to these semiconductor devices, it is desired to increase the efficiency for energy saving. In order to satisfy the requirement, it is effective to reduce conduction loss of the element, i.e., to reduce "ON resistance (Ron)."

Therefore, it has been tried to reduce the ON resistance by miniaturizing the cells. Particularly, it becomes possible to extend a channel width and increase a density sharply, by using the "trench gate structure" as the element structure.

FIG. 11 is a schematic diagram showing the sectional structure of a semiconductor device which was attempted by the Inventor of the present invention in the course of attaining this invention. That is, this figure expresses a cross-sectional structure near the gate of an n channel type MOSFET of trench gate type. An n-type epitaxial region 6 and a p-type base region 5 are laminated in this order on an n+ type substrate 7. And the trenches which intrude into the epitaxial layer 6 are formed from the surface. In the trench, an embedded gate which consists of a gate insulating film (gate oxide) 3 and an embedded gate electrode 1 is provided.

Interlayer insulation films 4 are appropriately provided on the embedded gates, and n-type source regions 2A and p+ type source regions 2B are provided around the top of the trenches, respectively. And a drain electrode 8 is appropriately provided in the back side of the substrate 7.

In this MOSFET, by applying a predetermined bias voltage to the gate electrodes 1, channel regions are formed in the circumference of the embedded trenches, and switching operation which turns the region between the source regions 2A and the drain regions into "ON" state is carried out.

Now, in such a semiconductor device, it is required not only to reduce "ON resistance", but also to reduce a switching loss (Qsw) in order to improve the efficiency of operation. In order to reduce the switching loss, it is important to reduce the "parasitic capacitance" of the element and thus increase the operation speed.

For example, in the case of performing inverter control by combining a plurality of switching elements, when a operation speed of an element is slow, it becomes necessary to set the "dead time" which makes all the switching elements that constitute an arm in an "OFF" state longer in order to prevent the penetrating current. Therefore, the switching loss arises.

In contrast to this, if the parasitic capacitance of the switching element is reduced and thus the operation speed becomes high, the "dead time" can be shortened and the loss can be reduced.

The parasitic capacitance of the semiconductor device illustrated in FIG. 11 can be divided into some components.

First, the capacity (Cgd) between the drain and the gate can be mentioned. The capacity (Cgd) is produced in the portion where the epitaxial region 6 and the gate oxides 3 are in contact.

Next, the capacity (Cds) between the drain and the source can be mentioned. This capacity is produced in the p-n junction part where the epitaxial region 6 and the base region 5 are in contact.

Moreover, the capacity (Cgs) between gate and source can be mentioned. This capacity is produced in the portion where the gate oxide 3 and the source regions 2A, and the gate oxide 3 and the base region 5 are in contact.

Since all of these capacitance components give rise to a loss to switching operation of the semiconductor device, it is necessary to reduce these capacities. And it is effective for reducing the capacitance to reduce the capacity (Cgd) between the drain and the gate especially among these capacitance components.

Possible methods to reduce these parasitic capacitances include making the area of the contact part smaller, and accelerating the depletion by lowering the carrier concentration of each semiconductor region. However, when using these methods, there is a problem that "ON resistance" and "parasitic capacitance" or "breakdown voltage" of the semiconductor device are in a relation of a trade-off. Therefore, the improvement of the whole performance was difficult.

Structures where Cgd may be reduced by thickening the thickness of the gate oxide at the bottom of the trench are disclosed in Japanese Patent Laid-Open Publication No. 2002-299619 and Japanese Patent No. 2917922

However, according to the Inventor's original investigation, it has tuned out that in the case of the structures disclosed in these documents, there was a problem that the reduction of the ON resistance (Ron) and the reduction of the switching loss (Qsw) are not compatible.

SUMMARY OF THE INVENTION

According to an embodiment of the invention, there is provided a semiconductor device comprising: a first semiconductor layer of a first conductivity type; a second semiconductor layer of a second conductivity type provided on the first semiconductor layer; a trench penetrating the second semiconductor layer and intruding into the first semiconductor layer; a thick gate insulating film provided on a inner wall of the trench below an upper surface of the first semiconductor layer; a thin gate insulating film provided on the inner wall of the trench at a part upper than the thick gate insulating film; a gate electrode filling the trench; and a semiconductor region of a second conductivity type selectively formed to adjoin the trench and to project from a bottom surface of the second semiconductor layer into the first semiconductor layer.

According to other embodiment of the invention, there is provided a semiconductor device comprising: a first semiconductor layer of a first conductivity type; a second semiconductor layer of a second conductivity type provided on the first semiconductor layer; a trench penetrating the second semiconductor layer and intruding into the first semiconductor layer; a thick gate insulating film provided on a inner wall of the trench below an upper surface of the first semiconductor layer; a thin gate insulating film provided on the inner wall of the trench at a part upper than the thick gate insulating film; a gate electrode filling the trench; and a semiconductor region of a second conductivity type adjoining the trench, the semiconductor region being formed by selectively reversing the conductivity type of a part of the first semiconductor layer near the second semiconductor layer.

According to other embodiment of the invention, there is provided a method to manufacture a semiconductor device comprising: forming a first semiconductor layer of a first conductivity type, a second semiconductor layer of a second conductivity type provided on the first semiconductor layer, a trench penetrating the second semiconductor layer and intruding into the first semiconductor layer, and a thick gate insulating film provided on a inner wall of the trench below an upper surface of the first semiconductor layer; introducing an impurity of a second conductivity type into a part of the first semiconductor layer above the thick gate insulating film and adjoining the trench to form a semiconductor region of a second conductivity type; forming a thin gate insulating film on the inner wall of the trench at a part upper than the thick gate insulating film; and filling the trench with a gate electrode.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION

Referring to drawings, some embodiments of the present invention will now be described in detail.

First Embodiment

Figure 1:
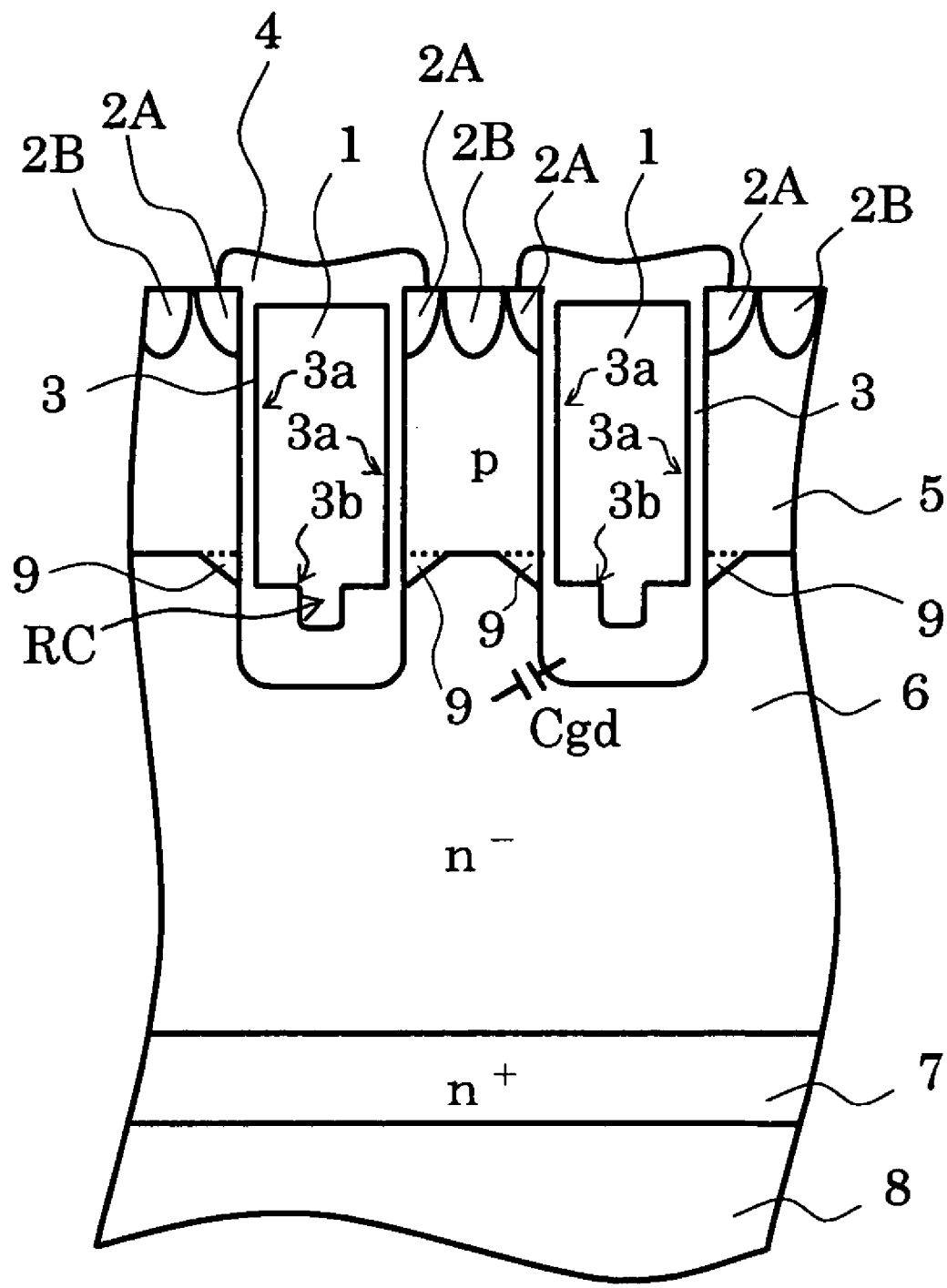
FIG. 1 is a schematic diagram illustrating the cross-sectional structure of the semiconductor device according to the first embodiment of the present invention.

FIG. 1 is a schematic diagram illustrating the cross-sectional structure of the semiconductor device according to the first embodiment of the present invention. That is, this figure expresses the principal part section structure near the gate of trench gate type n channel type MOSFET.

Figure 2:
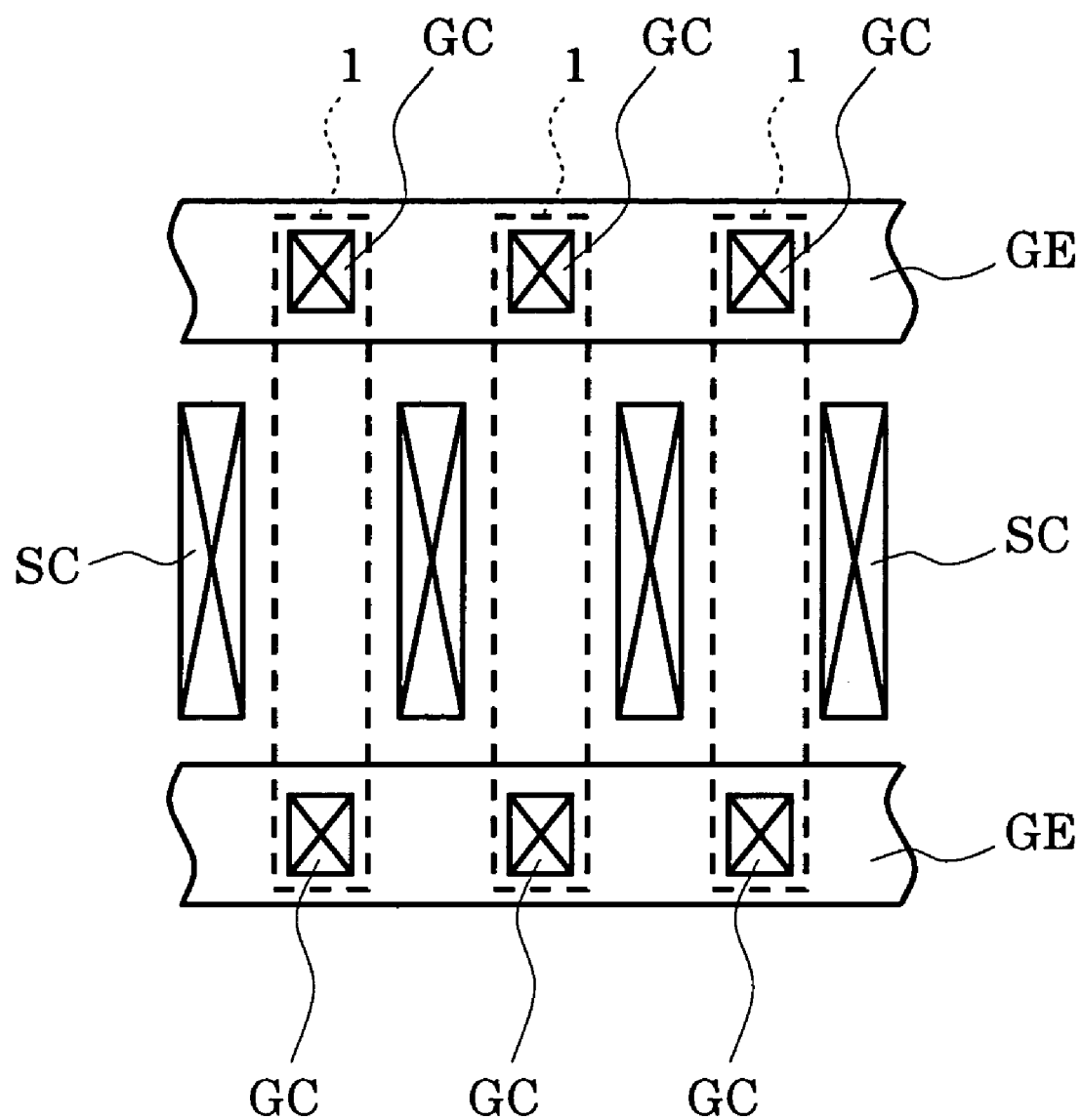
FIG. 2 is a perspective plan view illustrating the electrode structure of the semiconductor device shown in FIG. 1.

And FIG. 2 is a perspective plane view illustrating the electrode structure of this semiconductor device.

Before starting the explanation of the embodiment with reference to these figures, the comparative examples will be explained first. That is, the Inventor has found that in the case of the structures disclosed in the above-mentioned prior documents, there is a problem that the reduction of the ON resistance (Ron) and the reduction of the switching loss (Qsw) are not compatible.

Figure 12A:
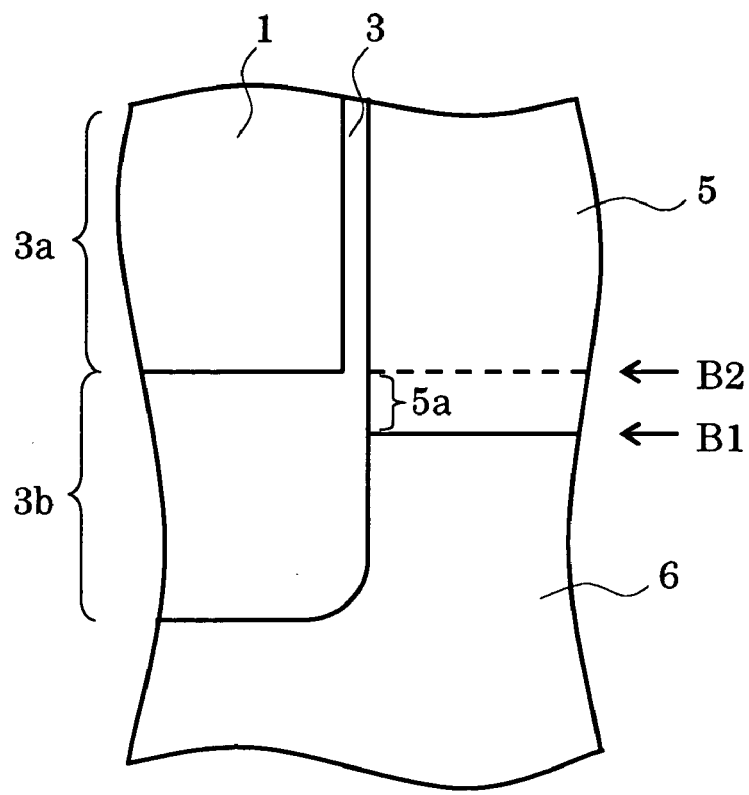
FIGS. 12A and 12B are sectional views which express the structures at the bottom of the trench indicated by documents.
Figure 12B:
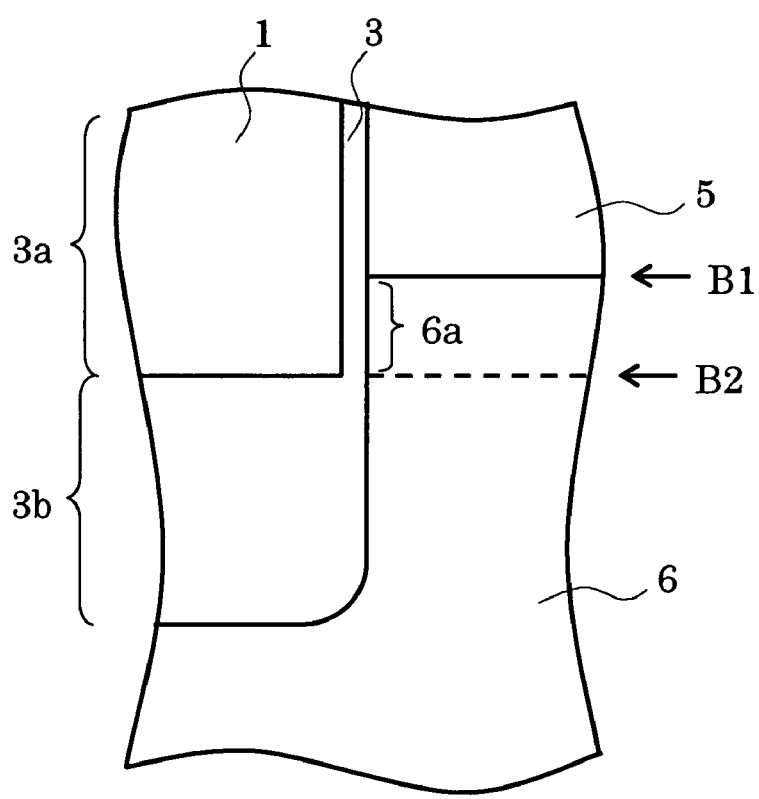

FIGS. 12A and 12B are sectional views which express the structures of the bottom of the trench disclosed in documents. That is, FIG. 12A expresses the structure disclosed in Japanese Patent Laid-Open Publication No. 2002-299619, and FIG. 12B expresses the structure disclosed in Japanese Patent No. 2917922.

In the case of the structure expressed in FIG. 12A, the gate oxide 3 has the gate oxide 3a which is thinner, and the gate oxide 3b which is thicker. And the boundary B1 between the p-type base region 5 and the epitaxial region 6 has shifted below the boundary B2 between the thin gate oxide 3a and the thick gate oxide 3b of the gate oxide 3. That is, the thick gate oxide 3b extends over above the boundary B1 between the p-type base region 5 and the n-type epitaxial region 6, i.e., extends to the p-type base region.

If the thickness of the part of the gate oxide 3 which adjoins the p-type base region 5 becomes thick, a channel region can not be formed satisfactorily by a gate voltage, and thus, the ON resistance (Ron) will increase. In the case of the structure expressed in FIG. 12A, such a problem arises in the portion of the region 5a.

On the other hand, in the case of the structure expressed in FIG. 12B, the boundary B1 is conversely shifted above the boundary B2. That is, the thin gate oxide 3a of the gate oxide 3 extends over to the n-type epitaxial layer 6. Then, in this overlapping part 6a, since the capacitance (Cgd) between the drain and the gate increases, the problem that the switching loss (Qsw) increases comes up.

Thus, if "deviation" arises between the boundary B1 and B2, the ON resistance or the switching loss (Qsw) will increase. That is, ideally, as expressed in FIG. 13, it is desirable to make the boundary between the thin gate oxide 3a and the thick gate oxide 3b of the gate oxide 3 in agreement with the boundary between the base region 5 and the epitaxial region 6.

However, it is very difficult to manufacture such ideal structure stably. Because, since the p-type base region 5 is formed by diffusing the p-type impurity from the surface of the epitaxial layer, the depth of the formation may vary. On the other hand, since the depth of the trench is also controlled by the process time during etching of RIE (reactive ion etching) etc., it cannot be avoided that a "variation" arises.

Figure 13:
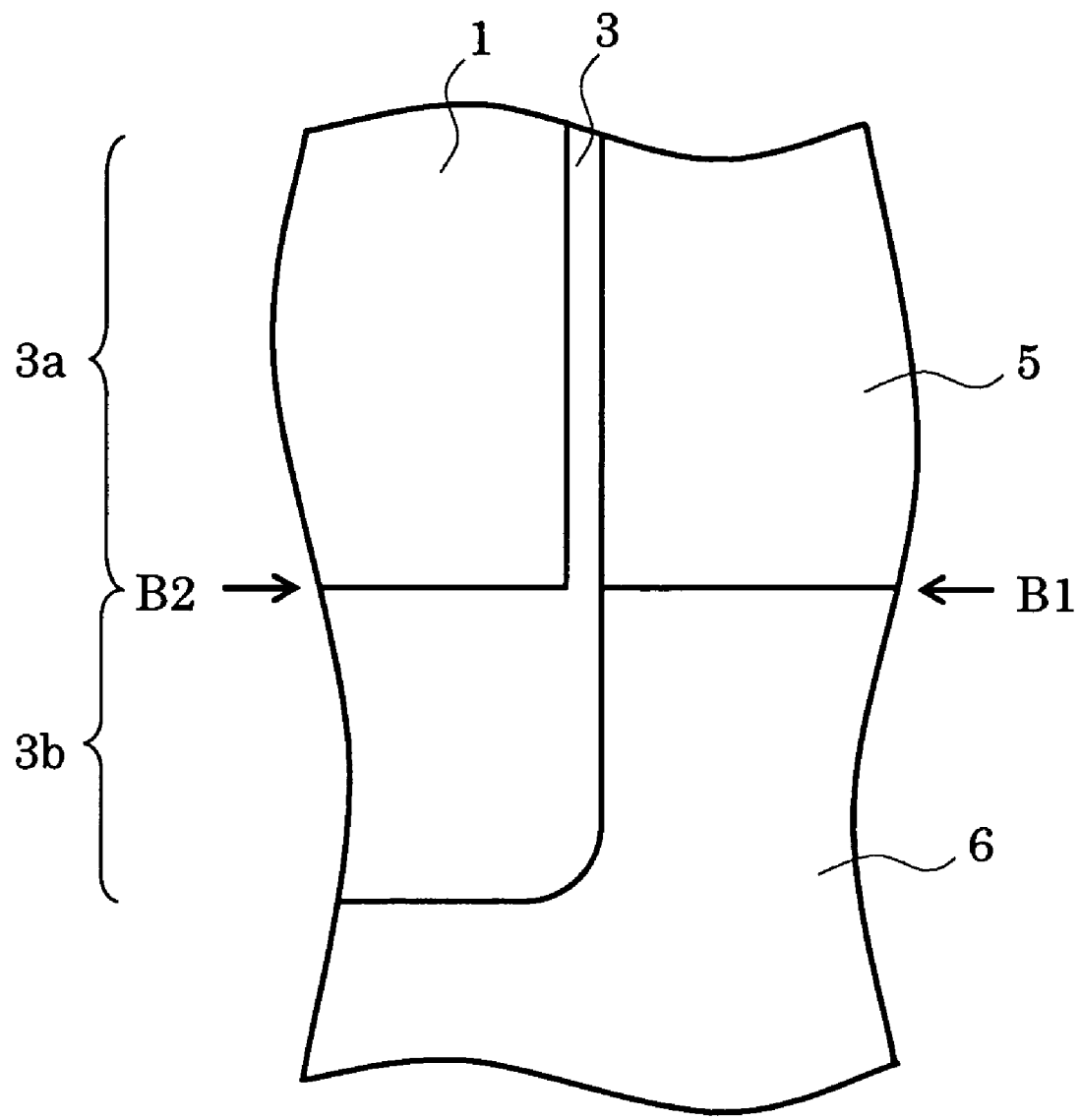
FIG. 13 is a sectional view showing the structure in which the boundary between the thin gate oxide film 3a and the thick gate oxide film 3b of the gate oxide film 3 are made be in agreement with the boundary between the base region 5 and the epitaxial region 6.

Therefore, if the upper end (or surface of the base region 5) of the trench is used as the reference or the bottom of the trench is used as the reference, it is difficult to realize the ideal arrangement relationship of the boundaries B1 and B2 as shown in FIG. 13 with sufficient reproducibility.

As explained in detail above, according to the conventional technology, it was difficult to acquire stably the structure which has the low ON resistance (Ron) and the low switching loss (Qsw) in the trench gate type semiconductor device.

The invention is made to overcome these drawbacks.

Now, turning back to FIGS. 1 and 2, the embodiment of the present invention will be described in detail.

As shown in FIG. 1, the n-type epitaxial region 6 and the p-type base region 5 are laminated in this order on the n+ type substrate 7. And the trenches which intrude into the epitaxial layer 6 are provided from the surface of the semiconductor. In the trench, the embedded gate which consists of the gate insulating film (gate oxide) 3 and the embedded gate electrode 1 is provided. The interlayer insulation films 4 are provided appropriately on the embedded gates. The n-type source regions 2A and the p+ type source regions 2B are provided around the top of the trenches, respectively. And the drain electrode 8 is appropriately provided on the back side of the substrate 7.

The plan structure of this MOSFET will be explained referring to FIG. 2. A plurality of embedded gate electrodes 1 formed in parallel as shown in FIG. 1 are connected to the gate electrode parts GE formed so as to intersect vertically with these embedded gate electrodes 1, at the gate contacts GC. The source wirings which are not illustrated are connected to the source regions 2A and 2B at the source contacts SC through the insulating interlayer films which are not illustrated. These gate wirings and source wirings are insulated with the insulating interlayer films which are not illustrated.

In the embodiment, the gate oxide 3 has the thin gate oxide 3a and the thick gate oxide 3b. And the p-type regions 9 are selectively provided near these boundaries in the semiconductor layer.

Figure 3:
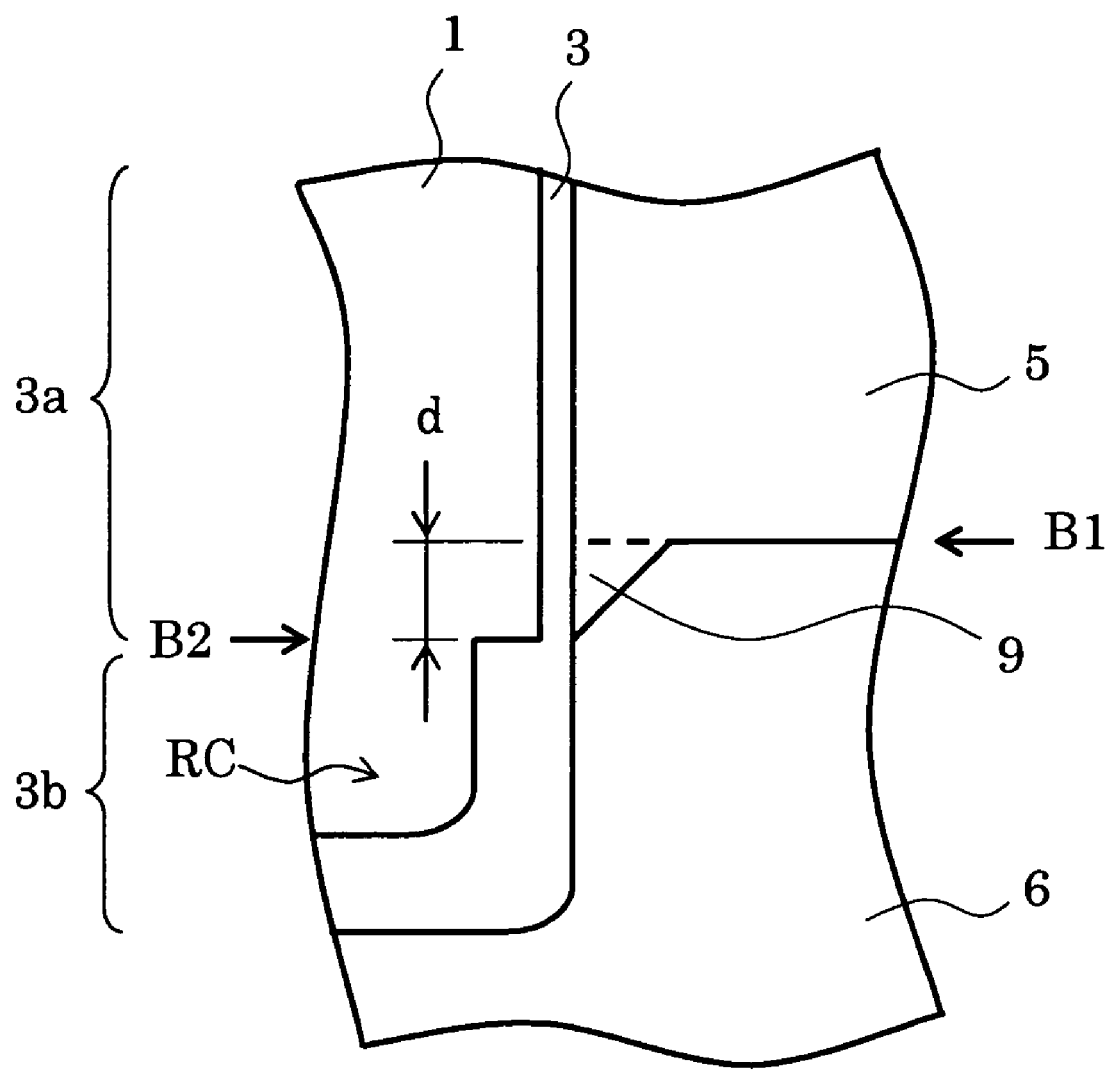
FIG. 3 is a principal part sectional view of enlarged part of near the p-type region 9.

FIG. 3 shows a sectional view of enlarged part of near the p-type region 9. The boundary B1 between the p-type base region 5 and the n-type epitaxial region 6 is shifted above the boundary B-2 between the thin gate oxide 3a and the thick gate oxide 3b of gate oxide 3 by a distance d outside the p-type region 9. The p-type region 9 is formed to be a part of the p-type base region 5 in an inclined fashion so as to connect the boundaries B1 and B2. Thus, the deviation between the boundaries B1 and B2 can be cancelled.

As a result, a channel can be formed also in the p-type region 9 like in p-type base region 5 by applying of a usual gate voltage.

According to the embodiment, the parasitic capacitance between the gate electrode 1 and the epitaxial region 6 can be reduced by providing the thick gate oxide 3b in the gate oxide 3. That is, the switching loss (Qsw) can be reduced by reducing the capacitance (Cgd) between the drain and the gate. For example, it becomes possible to reduce the capacitance between the drain and the gate by about 40% compared with the case where the part of the gate oxide 3 is not made into thick.

Moreover, in this embodiment, the thickness of the thick gate oxide 3b is smaller than the half of the width of the trench. Therefore, the recess RC surrounded by the thick gate oxide 3b is formed in the bottom of the trench, and this recess RC is also filled up with the gate electrode 1. By filling up with the gate electrode 1 the inside the thick gate oxide 3b, the so-called "accumulation layer effect" can be acquired.

That is, by forming the gate electrode 1 to adjoin the thick oxide film 3b in the trench at the level of the epitaxial region 6, and the electrons in the epitaxial region 6 are accumulated near the side wall of the trench when positive bias is applied to the gate electrode 1. Therefore, the increase of the ON resistance (Ron) can be more successfully suppressed than the structure where a flat thick oxide film is formed in the bottom of the trench as illustrated in FIG. 13.

Furthermore, the "deviation" between the boundaries B1 and B2 which were mentioned above with reference to FIGS. 12A and 12B can be canceled by providing the p-type region 9. That is, the boundary B1 can be made to incline below and coincide with the boundary B2 by providing the p-type region 9 near the gate oxide 3.

Thus, by making the boundary B1 substantially coincide with the boundary B2, the thin gate oxide 3a of the gate oxide 3 can be formed to extend over to epitaxial region 6.

Moreover, it can be successfully prevented that the thick gate oxide 3b of the gate oxide 3 may extend over to the p-type region 5. As the result, while the increase of the ON resistance (Ron) is suppressed, the capacitance (Cgd) between the drain and the gate can be reduced certainly and the switching loss (Qsw) can be reduced.

The p-type region 9 can be formed by introducing p-type impurity into a part of the n-type epitaxial region 6 from the inner side of the trench, or implanting the p-type impurity into a part of the n-type epitaxial region 6 from the surface of the base region 5. Particularly, when impurity is introduced from the inside the trench, it becomes possible to form the p-type region 9 in a self-aligning fashion according to the distribution of the thickness of the gate oxide 3.

Next, the carrier concentration of each region will be explained. The concentration of the p-type base region 5 is about $10^{17-1018}/cm^3$, and the concentration of the n-type epitaxial region 6 is in the order of $10^{16}/cm^3$. It is desirable to make the concentration of the p-type region 9 between the concentrations of the base region 5 and the epitaxial region 6. That is, the carrier concentration of the p-type region 9 can be set to about $10^{17}/cm^3$. If the carrier concentration of the p-type region 9 is set to this range, the reversal of the conduction-type of the n-type epitaxial region 6 can be caused easily by introducing the p-type impurity into it. Moreover, the carrier concentration of the p-type base region 5 will not go up too much.

Next, the manufacturing method of the semiconductor device of this embodiment will be explained.

FIGS. 4A through 4D are process sectional views showing the main part of the first manufacturing method of the semiconductor device of this embodiment.

Figure 4A:
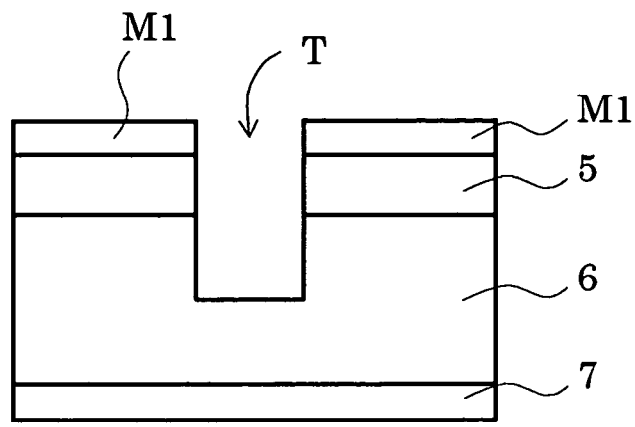
FIGS. 4A through 4D are process sectional views showing the main part of the first manufacturing method of the semiconductor device of the embodiment.

First, as shown in FIG. 4A, the p-type base region 5 is formed by diffusing p-type impurity from the surface of the semiconductor substrate 7 which has the n-type epitaxial region 6. Then, the mask pattern M1 which consists of SiO2 is formed. And the opening area of this mask M1 is etched and the first trench T which runs through to the epitaxial region 6 is formed. The depth of the trench T may be 1 micrometer, and the width (width in the horizontal direction in FIG. 4A) may be about 500 nm, for example.

Figure 4B:
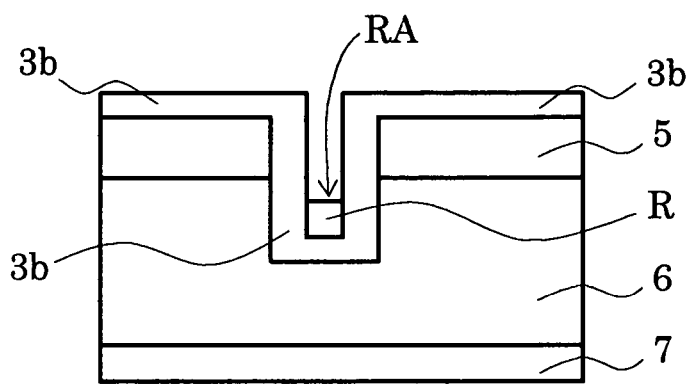

Next, as shown in FIG. 4B, after removing the mask M1, the thick oxide film 3b is formed on the inner wall of the trench T. The thickness of the oxide film 3b may be about 200 nm, for example. Then, the resist R is filled and the resist R is retreated from the wafer surface by methods, such as ashing. And as illustrated, it is adjusted so that the upper surface RA of the resist R may become below the p-type base region 5.

Figure 4C:
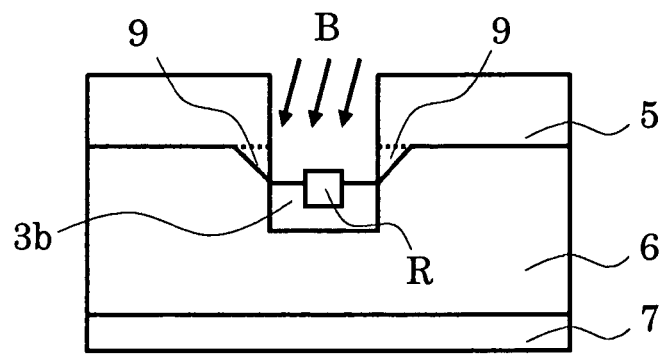

Next, as shown in FIG. 4C, the oxide film 3b is etched, using the resist R as a mask. That is, the oxide film 3b is selectively removed to the depth almost same level as the surface of the resist R. Then, the p-type region 9 is formed by introducing p-type impurity from inner wall of the trench T, using the resist R and the oxide film 3b selectively left behind at the trench bottom as a mask. As a method of introducing p-type impurity, a gaseous phase diffusion method and the ion implantation from slant can be used.

It is desirable that the amount of introduction of p-type impurity is in the range in which the conduction-type of the n-type epitaxial region 6 may be reversed to p-type as mentioned above, and in which the carrier concentration of the p-type base region 5 may not rise too much. Specifically, it is desirable to introduce the p-type impurity so that the carrier concentration of the p-type region 9 may be higher than that of the n-type epitaxial region 6 and lower than that of p-type base region 5.

Figure 4D:
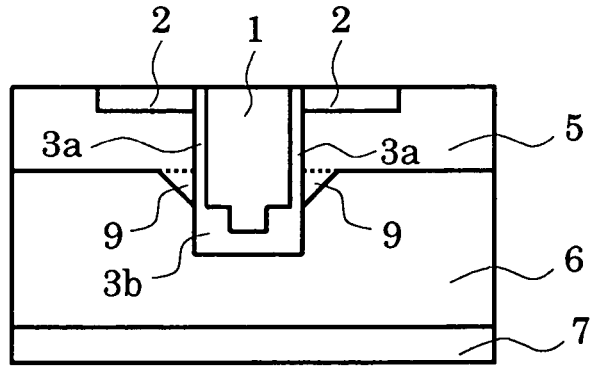

Then, as shown in FIG. 4D, the resist R is removed and the thin gate oxide 3a is formed inside the trench T, and residual space is filled up with the gate electrode 1. The thickness of the thin gate oxide 3a may be about 50 nm, for example. As a material of the gate electrode 1, polycrystalline silicon may be used, for example.

The main part of the semiconductor device of this embodiment is completed by forming the n-type source region 2 on the surface of the p-type base region 5, and by forming an insulating interlayer film and the drain electrode which are not illustrated.

According to the manufacturing method of this embodiment explained above, the p-type region 9 can be formed in a self-aligning fashion by introducing the p-type impurity from the inner wall of the trench by using the thick oxide film 3b as the mask, as mentioned above about FIG. 4C.

Thus, in the structure, as shown in FIG. 3, it is possible to make the boundary B1 between the p-type region 9 (it acts as a part of p-type base region 5) and the n-type epitaxial region 6, and the boundary B2 between the gate oxide films 3a and 3b coincide substantially.

As the result, the capacity (Cgd) between drain and gate can be reduced certainly while suppressing the increase in ON resistance (Ron), and thus, the switching loss (Qsw) can be reduced.

In this embodiment, as mentioned above with reference to FIG. 4B, it is desirable to form the upper surface of the resist R so that it may come below the p-type base region 5. In this case, it is not necessary to control the relationship of their levels precisely. It is because the p-type region 9 can be formed in a self-aligning fashion according to the embodiment.

As a process factor which influences the physical relationship of the upper surface of resist R and the p-type base region 5, "variations", such as the diffusion depth of the base region 5, the etching depth of the trench T, and the amount of etching at the time of retreating resist R, can be mentioned, for example.

However, according to the result of examination of the Inventor, even when such a "variation" arose on these process conditions, the upper surface of the resist R was always formed below the base region 5 by setting up the process conditions so that the upper surface of resist R may become lower about 200 nm than the p-type base region 5, for example. And it becomes possible to mass-produce the semiconductor device of this embodiment very stably by forming the p-type region 9 in a self-aligning fashion.

Next, the example of transformation of the manufacturing method of the semiconductor device of this embodiment will be explained.

Figure 5A:
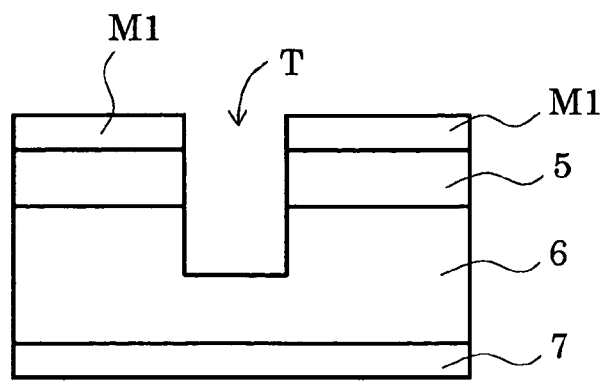
FIGS. 5A through 5E are cross sectional views showing the main part of the second manufacturing method of the semiconductor device of the embodiment.
Figure 5B:
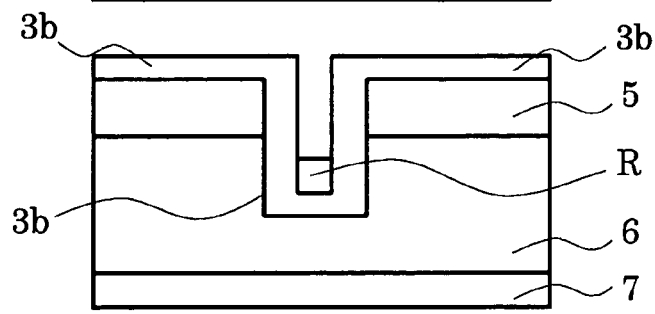

FIGS. 5A through 5E are cross sectional views showing the main part of the second manufacturing method of the semiconductor device of this embodiment. Since the processes shown in FIGS. 5A and 5B are essentially the same as the processes mentioned above with reference to FIGS. 4A and 4B, the detailed explanations will be omitted.

Figure 5C:
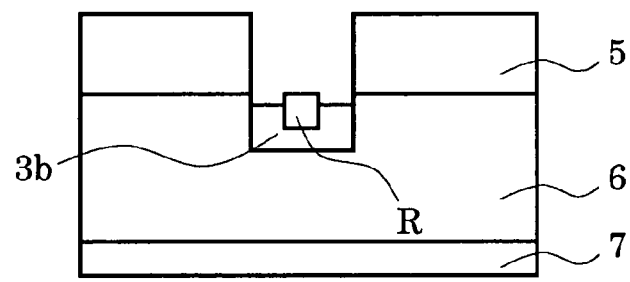

After these processes, in this example, as expressed in FIG. 5C, thick oxide film 3b is etched by using the resist R as a mask.

Figure 5D:
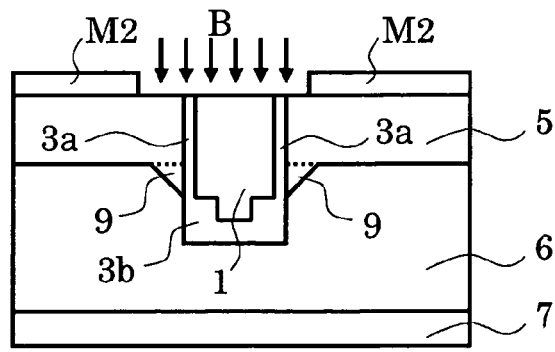
Figure 5E:
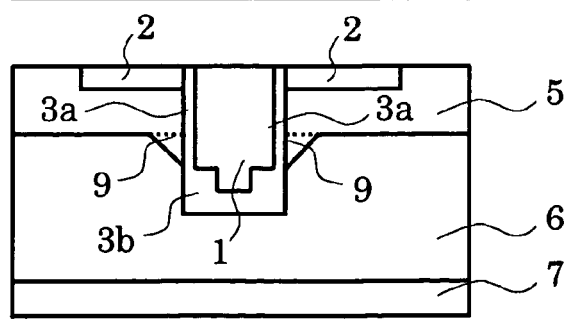

Then, as shown in FIG. 5D, the resist R is removed, thin gate oxide 3a is formed on the upper inner wall of the Trench T, and residual space is filled up with the gate electrode 1. Then, the p-type region 9 is formed by forming a mask M2 on the surface of the p-type base region 5, and by introducing the p-type impurity through the opening. In this case, since it is necessary to introduce p-type impurity deeply from the wafer surface, it is desirable to use the ion implantation of high energy etc.

Then, the mask M2 is removed, the n-type source region 2 is formed on the surface of the p-type base region 5 and an insulating interlayer film, a drain electrode, etc. which are not illustrated are formed. Thus, the main portion of the semiconductor device of this embodiment will be completed.

According to the second manufacturing method of this embodiment explained above, the p-type region 9 is formed by introducing the p-type impurity from the wafer surface and it is capable of reducing the capacitance (Cgd) between drain and gate certainly and reducing switching loss (Qsw), while suppressing the increase in ON resistance (Ron).

Next, the further example of transformation of the manufacturing method of the semiconductor device of this embodiment will be explained.

FIGS. 6A through 6D are cross sectional views showing the principal part of the third manufacturing method of the semiconductor device of this embodiment.

Figure 6A:
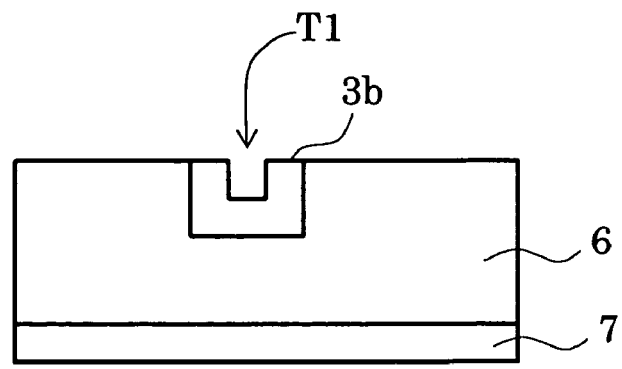
FIGS. 6A through 6D are cross sectional views showing the main part of the third manufacturing method of the semiconductor device of the embodiment.

In this example of transformation, as shown in FIG. 6A, the n-type epitaxial region 6 is formed on the substrate 1, and the formation of the first trench T1 is carried out.

Then, the thick oxide film 3b is formed on the inner wall of the trench T1 with a thickness smaller than the half of the width of the trench T1.

Figure 6B:
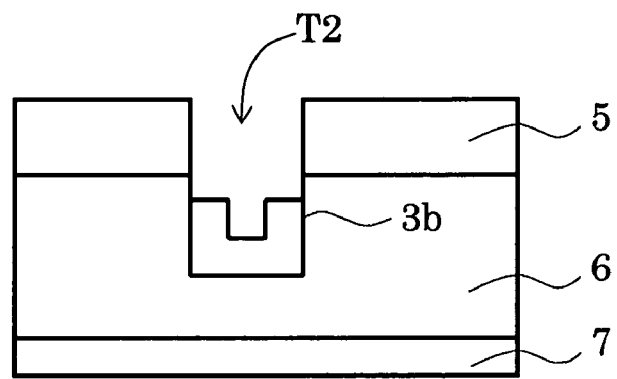

Then, as shown in FIG. 6B, the p-type base region 5 is grown epitaxially. And the formation of the second trench T2 is carried out so that it may continue on the first trench T1. Further, the thick oxide film 3b exposed to the bottom of the second trench T2 is etched, and thus, the upper surface is retreated. By performing this etching process, the upper surface of the oxide film 3b can be retreated below the p-type base region 5.

Figure 6C:
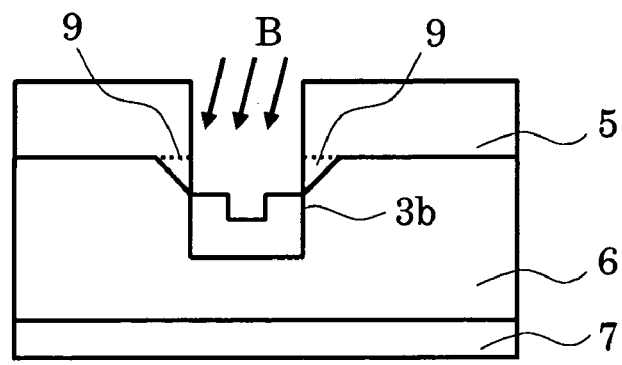

Next, as shown in FIG. 6C, the p-type impurity is introduced from the inner walls of the trenches T1 and T2.

This process can be carried out in the same way like what was mentioned above with reference to FIG. 4C.

Figure 6D:
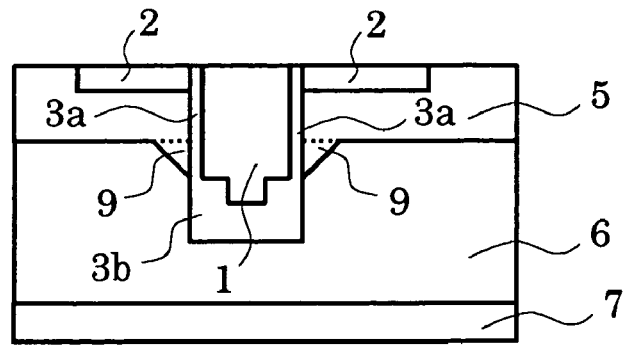

And as shown in FIG. 6D, the thin gate oxide 3a is formed on the inner wall of the trenches T1 and T2, and residual space is filled up with the gate electrode 1. The thickness of the gate oxide 3a may be about 50 nm, for example. As a material of the gate electrode 1, polycrystalline silicon may be used, for example.

Then, the main portion of the semiconductor device of this embodiment will be completed by forming the n-type source regions 2 on the surface of the p-type base region 5 and by forming an insulating interlayer film and a drain electrode which are not illustrated.

According to the third manufacturing method of this embodiment explained above, as shown in FIG. 6B, the thick oxide film 3b can be formed certainly below the p-type base region 5 by retreating the upper surface of the thick oxide film 3b. Then, it becomes possible to reduce the capacitance (Cgd) between the drain and the gate, and to reduce the switching loss (Qsw), while controlling the increase of the ON resistance (Ron), by forming the p-type region 9 in a self-aligning fashion.

Second Embodiment

Next, the second embodiment of the invention will be explained.

Figure 7:
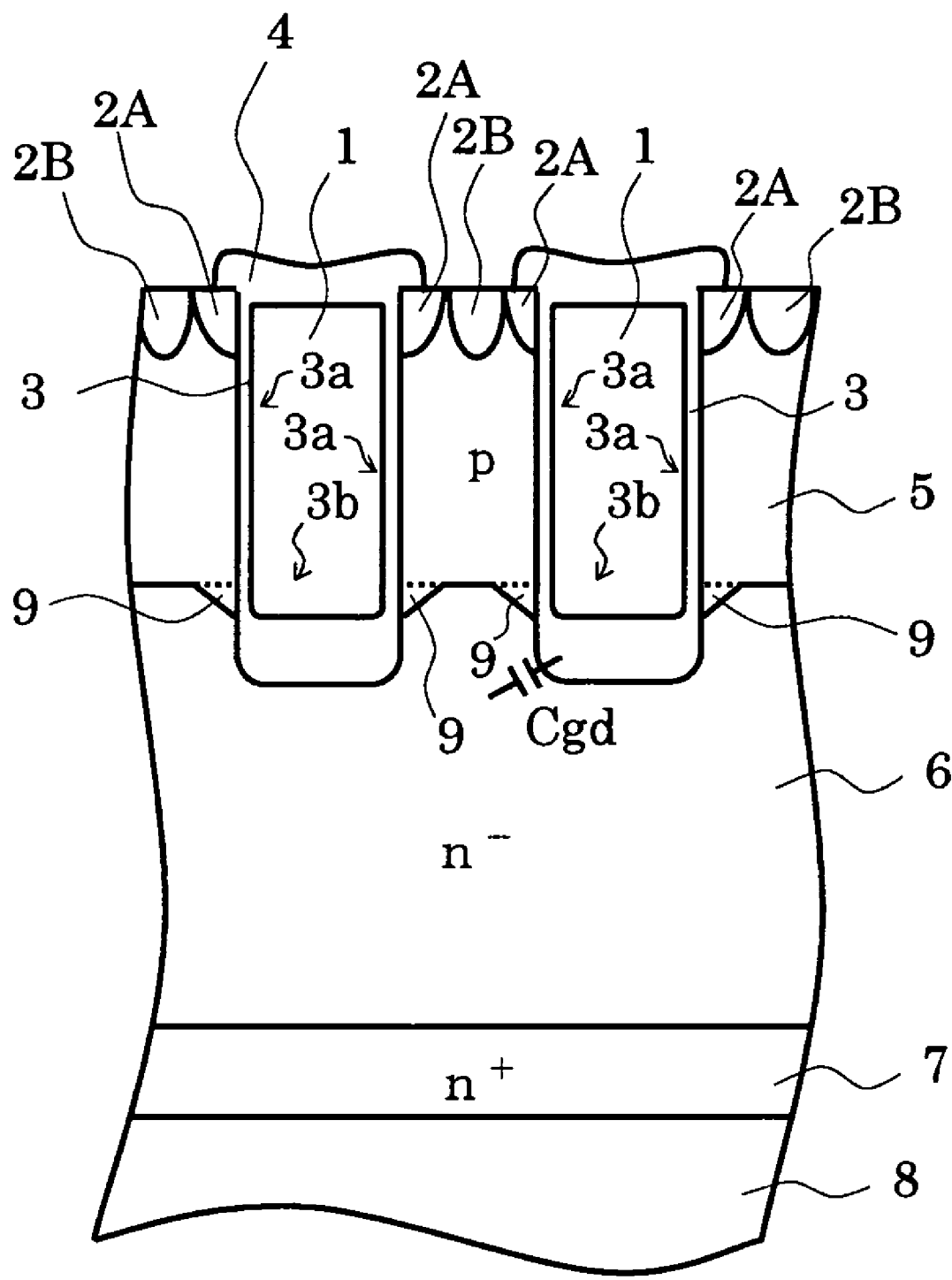
FIG. 7 is a schematic diagram illustrating the cross-sectional structure of the semiconductor device according to the second embodiment of the invention.

FIG. 7 is a schematic diagram illustrating the cross-sectional structure of the semiconductor device according to the second embodiment of the invention. The same symbols are given to the same elements as what were mentioned above with reference to FIGS. 1 through 6D about this figure, and detailed explanation will be omitted.

In this embodiment, the thick gate oxide film 3b of the gate oxide film 3 is formed so that the bottom of the trench may be filled substantially flat. That is, the gate oxide film 3b is formed so that it may have a larger thickness than the half of the width of the trench. Then, as expressed in FIG. 7, the thick gate oxide film 3b will be formed so that the bottom of the trenches may be filled flat.

According to the embodiment, the parasitic capacitance between the gate electrode 1 and the epitaxial region 6 can also be reduced. That is, the switching loss (Qsw) can be reduced by reducing the capacitance (Cgd) between the drain and the gate. For example, the capacitance between the drain and the gate can be reduced by about 40% or more, compared with the case where the gate oxide 3 is not formed thick.

Moreover, also in this embodiment, a "variation" of the boundary B1 and B2 which was mentioned above with reference tot FIG. 12A and 12B can be canceled by forming the p-type region 9. That is, it becomes possible to make the boundary B1 incline downward and coincide with the boundary B2 by providing the p-type region 9 near the gate oxide 3.

Thus, it becomes possible to reduce the capacitance (Cgd) between the drain and the gate, and to reduce the switching loss (Qsw), while suppressing the increase of the ON resistance (Ron) by making the boundary B1 substantially coincide with the boundary B2. According to the embodiment, the p-type region 9 may also be formed in a self-aligning fashion as explained later.

Hereafter, the manufacturing method of the semiconductor device of this embodiment will be explained.

FIGS. 8A through 8D are cross sectional views showing the main part of the first manufacturing method of the semiconductor device of this embodiment.

Figure 8A:
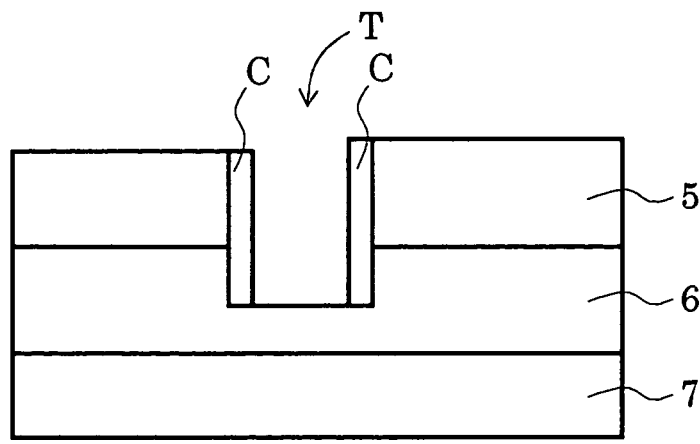
FIGS. 8A through 8D are cross sectional views showing the main part of the first manufacturing method of the semiconductor device of the embodiment.

In this example, as shown in FIG. 8A, the n-type epitaxial region 6 and the p-type base region 5 are formed on the substrate 7. And the trench T which runs through the p-type base region 5 and intrudes into the epitaxial region 6 is formed. Furthermore, the covering layers C which consist of silicon nitride (SiNx) are formed on the inner side-wall of the trench T.

Figure 8B:
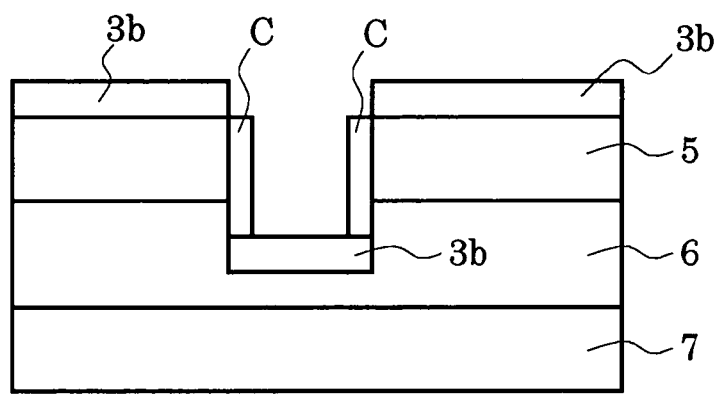

Next, as shown in FIG. 8B, the surface of the base region 5 which is not covered with the covering layer C and the bottom of the trench T are oxidized, and the thick oxide films 3b are formed. The oxide films 3b can be formed by so-called thermal oxidation method or the method of forming the thick oxide films 3b with the injection method of the neutral particle of oxygen. In this process, if the depth of the trench T is suitably adjusted so that the trench T intrudes into the epitaxial region 6, it is easy to provide the upper surface of the thick oxide film 3b below the p-type base region 5.

Figure 8C:
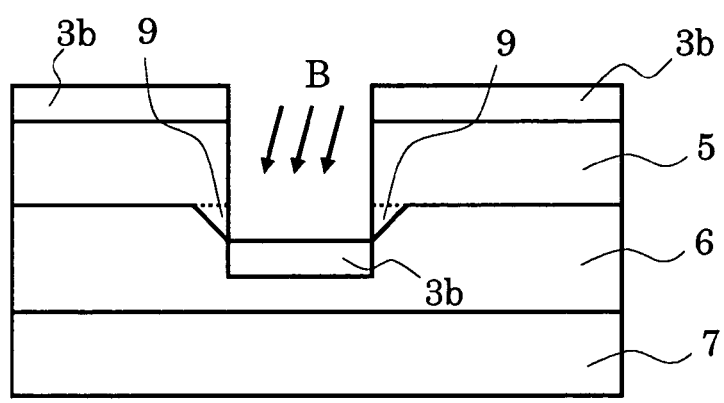

Then, as shown in FIG. 8C, the covering layers C are removed, the p-type impurity is introduced from the side wall of the trench T, and thus, the p-type region 9 is formed.

Also in this case, the thick oxide film 3b acts as a mask, and the p-type region 9 can be formed in a self-aligning fashion.

Figure 8D:
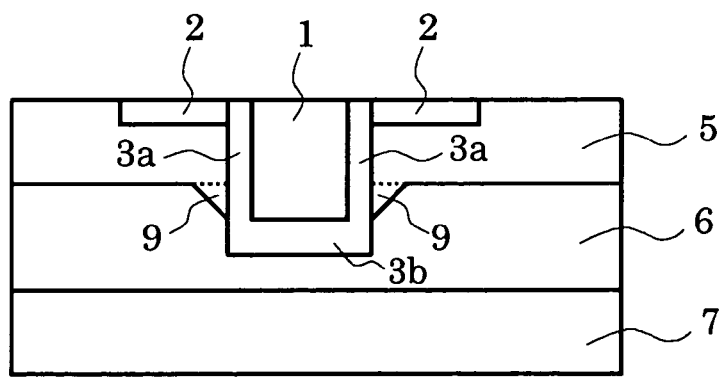

Then, as shown in FIG. 8D, the thin oxide film 3a is formed on the side wall of the trench T, and residual space is embedded with the gate electrode 1. Furthermore, the main portion of the semiconductor device of this embodiment is completed by removing the thick oxide film 3b on the surface of the p-type base region 5, and forming the n-type source regions 2.

As explained above, according to the manufacturing method of this embodiment, it becomes easy to form the thick oxide film 3b which fills the bottom of the trench flat. And it becomes possible to mass-produce the semiconductor device where the capacitance (Cgd) between the drain and the gate is reduced, and the switching loss (Qsw) is reduced, while suppressing the increase of the ON resistance (Ron) by forming the p-type region 9 in a self-aligning fashion.

Next, the example of transformation of the manufacturing method of the semiconductor device of this embodiment will be explained.

FIGS. 9A through 9D are cross sectional views showing the main part of the second manufacturing method of the semiconductor device of this embodiment.

Figure 9A:
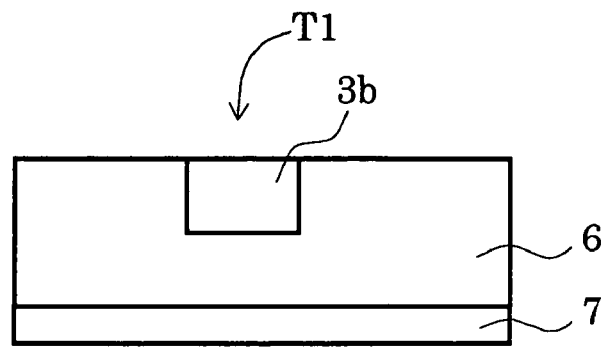
FIGS. 9A through 9D are cross sectional views showing the main part of the second manufacturing method of the semiconductor device of the embodiment.

In this example of transformation, as shown in FIG. 9A, the n-type epitaxial region 6 is formed on the substrate 7, and the first trench T1 is formed. And the thick oxide film 3b is formed so as to fill up into the inside of the trench T1.

Figure 9B:
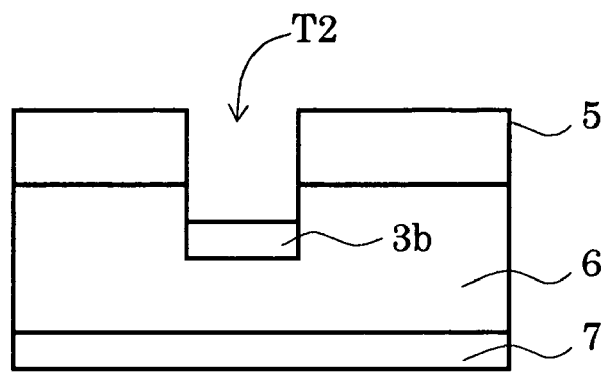

Then, as shown in FIG. 9B, the p-type base region 5 is grown epitaxially. And the second trench T2 is formed so that it may continue to the first trench T1. Then, the thick oxide film 3b exposed at the bottom of the second trench T2 is etched and the upper surface thereof is retreated. By the etching process, the upper surface of the oxide film 3b can be retreated below the p-type base region 5.

Figure 9C:
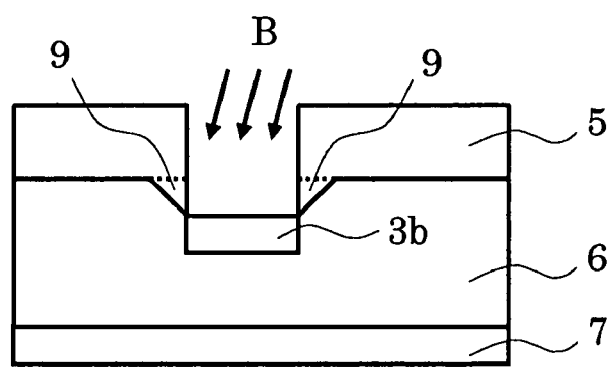

Next, as shown in FIG. 9C, the p-type impurity is introduced from the inner wall of the trenches T1 and T2. This process can be carried out like what was mentioned above about FIG. 4C.

Figure 9D:
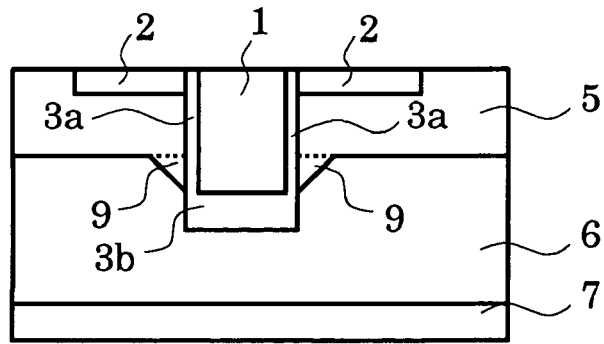

And as shown in FIG. 9D, the thin gate oxide 3a is formed on the inner wall of the trenches T1 and T2, and residual space is filled up with the gate electrode 1. Furthermore, by forming the n-type source regions 2 on the surface of the p-type base region 5, and by forming the insulating interlayer film and the drain electrode which are not illustrated, the principal part of the semiconductor device of this embodiment will be completed.

In the second manufacturing method of this embodiment explained above, as shown in FIG. 9B, the upper surface of thick oxide film 3b can be certainly formed below the p-type base region 5 by making it retreat. Then, it becomes possible to reduce the capacitance (Cgd) between drain and gate, and to reduce the switching loss (Qsw), while controlling increase of ON resistance (Ron) by forming the p-type region 9 in a self-aligning fashion.

Heretofore, the embodiments of the present invention have been explained, referring to the examples. However, the present invention is not limited to these specific examples.

For example, the present invention can be applied to various kinds of semiconductor devices which have the so-called "trench type gate" and they attain the similar effect. So these semiconductor devices are also included in the scope of the present invention.

Moreover, about material, the conduction-type, carrier concentration, impurity, thickness, arrangement relations, etc. of each component of the semiconductor device explained above may be appropriately selected by those skilled in the art with the known techniques to carry out the invention as taught in the specification and obtain equivalent effects.

Furthermore, the same can be mentioned about a manufacturing method. That is, although the example of exposing the semiconductor layer in the inner wall of the trench as shown in FIG. 4C in order to form the p-type region 9 in a self-aligning fashion was illustrated, the present invention is not limited to this specific example.

Figure 10:
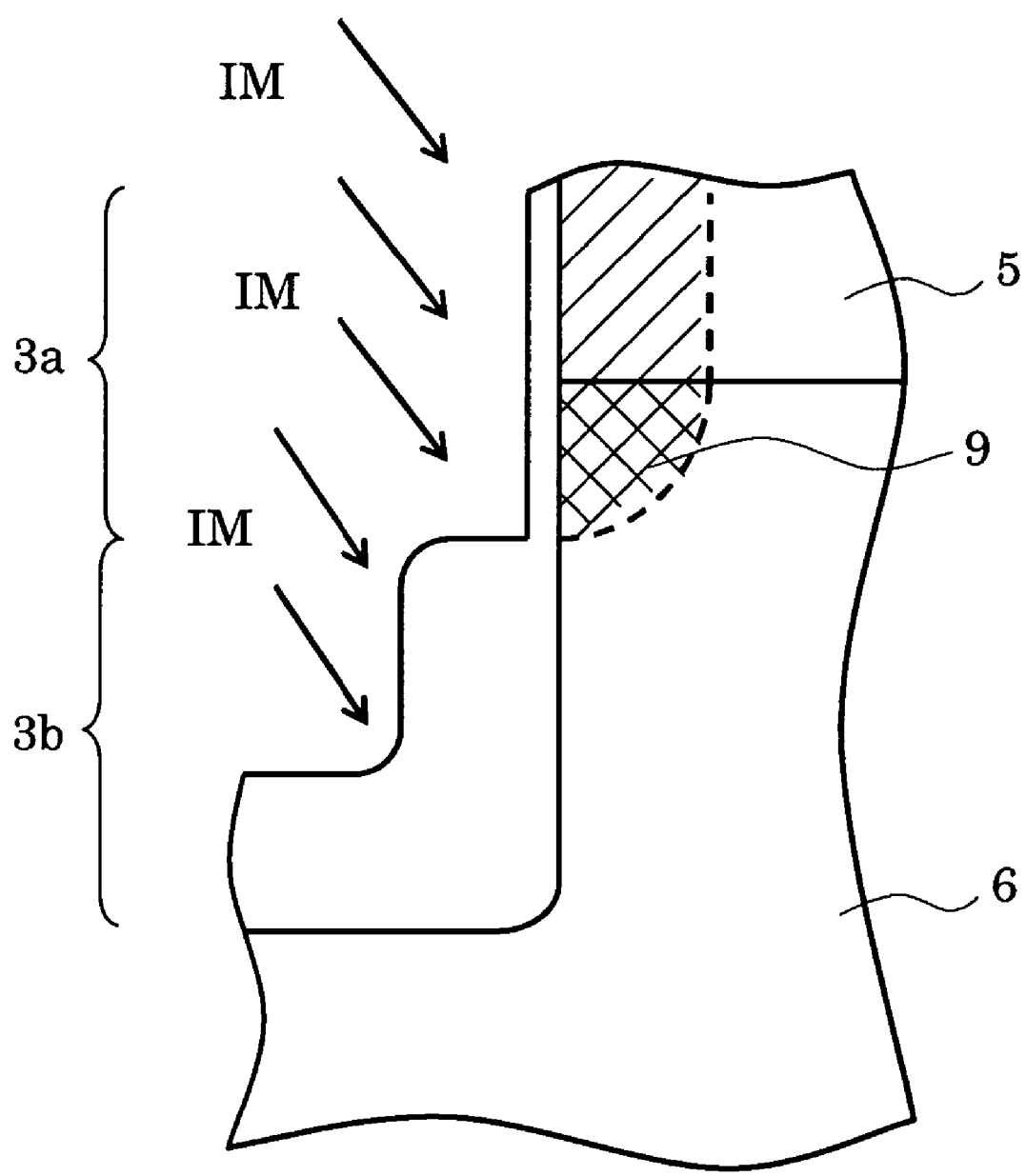
FIG. 10 is a main part of sectional view showing another method of forming p-type region 9 in a self-aligning fashion.
Figure 11:
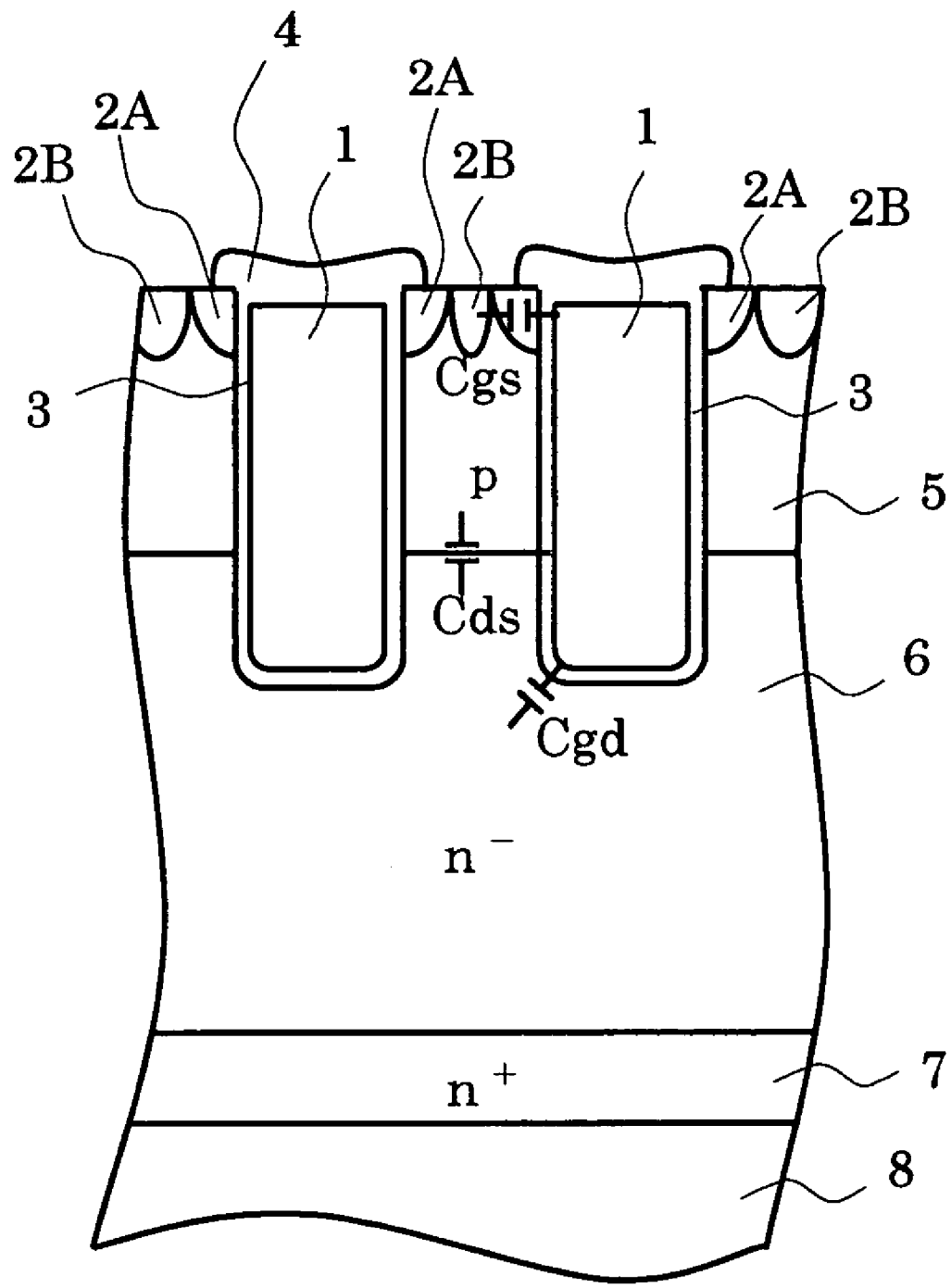
FIG. 11 is a schematic diagram showing the semiconductor device which was attempted by the Inventor of the present invention in the course of attaining this invention.

FIG. 10 is a partly enlarged sectional view showing another method of forming the p-type region 9 in a self-aligning fashion. That is, after forming the thin oxide film 3a and the thick oxide film 3b, the p-type impurity IM may be introduced through these films.

Here, for example, the silicon oxide whose thickness is about 50 nm can be used as the thin oxide film 3a, and the silicon oxide whose thickness is about 200 nm can be used as the thick oxide film 3b. Thus, when both thicknesses differ, it becomes easy to introduce the p-type impurity IM so that it penetrate the thin oxide film 3a and don't penetrate the thick oxide film 3b. That is, the thick oxide film 3b acts as a mask for the p-type impurity IM.

In this case, the portion expressed by the hatch pattern in FIG. 10 is the region where the p-type impurity is introduced, and the portion expressed by the cross hatch corresponds to the p-type region 9. As the result, the p-type region 9 can be formed in a self-aligning fashion.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor device comprising:
   a first semiconductor layer of a first conductivity type;
   a second semiconductor layer of a second conductivity type provided on the first semiconductor layer;
   a trench penetrating the second semiconductor layer and intruding into the first semiconductor layer;
   a thick gate insulating film provided on a inner wall of the trench below an upper surface of the first semiconductor layer;
   a thin gate insulating film provided on the inner wall of the trench at a part upper than the thick gate insulating film;
   a gate electrode filling the trench; and
   a semiconductor region of a second conductivity type selectively formed to adjoin the trench and to project from a bottom surface of the second semiconductor layer into the first semiconductor layer,
   a lower end of a part of the semiconductor region of the second conductivity type in contact with the trench being substantially at a same level as a boundary between the thick gate insulating film and the thin gate insulating film, and
   a carrier concentration of the semiconductor region of the second conductivity type being higher than a carrier concentration of the first semiconductor layer and lower than a carrier concentration of the second semiconductor layer.

2. The semiconductor device according to claim 1, wherein:
   the thick gate insulating film has a thickness smaller than a half of a width of the trench,
   a recess enclosed by the thick gate insulating film is provided near a bottom of the trench, and
   the gate electrode fills the recess.

3. The semiconductor device according to claim 1, wherein:
   a bottom of the trench is filled with the thick gate insulating film so that a flat surface is formed by the thick gate insulating film.

4. The semiconductor device according to claim 1, wherein:
   the semiconductor region of the second conductivity type is formed in a self-aligning fashion to the thick gate insulating film.

5. The semiconductor device according to claim 1, wherein:
   a channel is able to be formed near the trench in a part of the second semiconductor layer and in a part of the semiconductor region by applying a predetermined voltage to the gate electrode.

6. The semiconductor device according to claim 1, wherein:
   a thickness of the semiconductor layer of the second conductivity type is greater than a width of the semiconductor region of the second conductivity type at a part adjoining the second semiconductor layer.

7. A semiconductor device comprising:
   a first semiconductor layer of a first conductivity type;
   a second semiconductor layer of a second conductivity type provided on the first semiconductor layer;
   a trench penetrating the second semiconductor layer and intruding into the first semiconductor layer;
   a thick gate insulating film provided on a inner wall of the trench below an upper surface of the first semiconductor layer;
   a thin gate insulating film provided on the inner wall of the trench at a part upper than the thick gate insulating film;
   a gate electrode filling the trench; and
   a semiconductor region of a second conductivity type adjoining the trench, the semiconductor region being formed by selectively reversing the conductivity type of a part of the first semiconductor layer near the second semiconductor layer,
   a lower end of a part of the semiconductor region of the second conductivity type in contact with the trench being substantially at a same level as a boundary between the thick gate insulating film and the thin gate insulating film, and a carrier concentration of the semiconductor region of the second conductivity type being higher than a carrier concentration of the first semiconductor layer and lower than a carrier concentration of the second semiconductor layer.

8. The semiconductor device according to claim 7, wherein:

the thick gate insulating film has a thickness smaller than a half of a width of the trench, a recess enclosed by the thick gate insulating film is provided near a bottom of the trench, and the gate electrode fills the recess.

9. The semiconductor device according to claim 7, wherein:

a bottom of the trench is filled with the thick gate insulating film so that a flat surface is formed by the thick gate insulating film.

10. The semiconductor device according to claim 7, wherein:

the semiconductor region of the second conductivity type is formed in a self-aligning fashion to the thick gate insulating film.

11. The semiconductor device according to claim 7, wherein:

a channel is able to be formed near the trench in a part of the second semiconductor layer and in a part of the semiconductor region by applying a predetermined voltage to the gate electrode.

12. The semiconductor device according to claim 7, wherein:

a thickness of the semiconductor layer of the second conductivity type is greater than a width of the semiconductor region of the second conductivity type at a part adjoining the second semiconductor layer.

* * * * *